(12) United States Patent
Kim et al.

(10) Patent No.: US 7,720,374 B2
(45) Date of Patent: May 18, 2010

(54) CAMERA MODULE

(75) Inventors: Young-Seok Kim, Incheon (KR); Hyeok-Hwan Kwon, Gyeonggi-Do (KR); Hyun-Kyu Choi, Chungcheongnam-Do (KR); Hwan-Chul Lee, Incheon (KR)

(73) Assignee: Optopac Co, Ltd., Bisan-Dong Dongan-Gu, Anyang-Si, Gyeonggi-Do (KR)

( * ) Notice: Subject to any disclaimer, the term of this patent is extended or adjusted under 35 U.S.C. 154(b) by 614 days.

(21) Appl. No.: 11/457,766

(22) Filed: Jul. 14, 2006

(65) Prior Publication Data

US 2007/0241273 A1 Oct. 18, 2007

(30) Foreign Application Priority Data

Apr. 14, 2006 (KR) .................. 10-2006-0033901
May 26, 2006 (KR) .................. 10-2006-0047510
Jun. 23, 2006 (KR) .................. 10-2006-0056777

(51) Int. Cl.
*G03B 7/26* (2006.01)

(52) U.S. Cl. ................. 396/275; 396/529; 348/374

(58) Field of Classification Search ............... 250/239; 396/275, 529, 542; 348/335, 340, 374, 376; 257/433, 225

See application file for complete search history.

(56) References Cited

U.S. PATENT DOCUMENTS

| | | | | |
|---|---|---|---|---|
| 5,949,655 | A * | 9/1999 | Glenn | 361/783 |
| 6,122,009 | A * | 9/2000 | Ueda | 348/335 |
| 6,476,417 | B2 * | 11/2002 | Honda et al. | 257/59 |
| 6,541,284 | B2 * | 4/2003 | Lam | 438/7 |
| 6,836,018 | B2 * | 12/2004 | Kim et al. | 257/773 |
| 7,005,310 | B2 * | 2/2006 | Hanada et al. | 438/25 |
| 7,038,287 | B2 * | 5/2006 | Kim et al. | 257/433 |

(Continued)

FOREIGN PATENT DOCUMENTS

CN 1661805 8/2005

(Continued)

*Primary Examiner*—Melissa J Koval
*Assistant Examiner*—Linda B Smith

(57) ABSTRACT

The present invention relates to a camera module, which comprises a packaged image sensor, an IR filter, a lens and a holder for holding these components and has a reduced overall size and height. A camera module according to the present invention comprises an image sensor package having a translucent substrate formed thereon; and a holder having a lower end attached to the translucent substrate of the image sensor package. At this time, the holder comprises a horizontal portion formed with a through-hole and a connecting portion extending downwardly from an edge of the horizontal portion, and an end surface of a lower end of the connecting portion is formed with an inner stepped portion so as to be attached to a peripheral portion of a top surface and a lateral surface of the translucent substrate. Alternatively, the holder comprises a horizontal portion formed with a through-hole and a connecting portion extending downwardly from an edge of the horizontal portion, and an end surface of a lower end of the horizontal portion is formed to be flat such that it is attached to a peripheral portion of a top surface of the translucent substrate. Otherwise, the holder comprises a horizontal portion formed with a through-hole, and a bottom surface of the horizontal portion is attached to at least a peripheral portion of a top surface of the translucent substrate.

13 Claims, 9 Drawing Sheets

U.S. PATENT DOCUMENTS

| | | | |
|---|---|---|---|
| 7,061,106 B2 * | 6/2006 | Yang et al. | 257/723 |
| 7,122,874 B2 * | 10/2006 | Kim | 257/433 |
| 7,199,359 B2 * | 4/2007 | Webster | 250/239 |
| 7,379,113 B2 * | 5/2008 | Kong et al. | 348/340 |
| 7,411,230 B2 * | 8/2008 | Maeda et al. | 257/225 |
| 7,414,661 B2 * | 8/2008 | Hartlove et al. | 348/340 |
| 2002/0036509 A1 * | 3/2002 | Fukasawa et al. | 324/754 |
| 2004/0012698 A1 * | 1/2004 | Suda et al. | 348/315 |
| 2004/0032523 A1 | 2/2004 | Hartlove et al. | |
| 2004/0189854 A1 * | 9/2004 | Tsukamoto et al. | 348/340 |
| 2005/0237415 A1 | 10/2005 | Kong et al. | |
| 2005/0285016 A1 * | 12/2005 | Kong et al. | 250/208.1 |
| 2006/0171698 A1 * | 8/2006 | Ryu et al. | 396/114 |

FOREIGN PATENT DOCUMENTS

| | | |
|---|---|---|
| JP | 11-341366 | 12/1999 |
| JP | 2002-118776 | 4/2002 |
| KR | 10-2005-0016484 | 2/2005 |
| KR | 20-0387531 | 6/2005 |
| KR | 2005-0109140 | 11/2005 |
| KR | 10-2006-0013125 | 2/2006 |
| KR | 10-2006-0017953 | 2/2006 |
| TW | I244715 | 12/2005 |

* cited by examiner

CAMERA MODULE

CROSS-REFERENCE TO RELATED APPLICATIONS

This U.S. non-provisional patent application claims priority under 35 U.S.C. §119 of Korean Patent Applications 2006-0033901 filed on Apr. 14, 2006, 2006-0047510 filed May 26, 2006 and 2006-0056777 filed Jun. 23, 2006, the entire contents of which are hereby incorporated by reference.

BACKGROUND OF THE INVENTION

1. Field of the Invention

The present invention relates to a camera module, and more particularly, to a camera module, which comprises a packaged image sensor, an IR filter, a lens and a holder for holding these components and has a reduced overall size and height.

2. Description of the Prior Art

Image sensors are semiconductor devices having the function of photographing images of human beings or objects. The market of these image sensors has been rapidly expanded as they have been loaded into portable phones as well as common digital cameras or camcorders. Such an image sensor is configured in the form of a camera module and mounted in the aforementioned apparatuses. A camera module comprises a lens, a holder, an infrared (IR) filter, an image sensor, and a printed circuit board. An image is formed by the lens of the camera module, the image formed by the lens is concentrated on the image sensor through the IR filter, and an optical signal of the image is converted into an electrical signal by the image sensor so as to photograph the image.

Among these components, the image sensor for converting an optical signal into an electrical signal is directly mounted as a bare chip on the camera module, or mounted on the camera module after an image sensor chip is packaged.

Among several methods of directly mounting a bare chip of an image sensor on a camera module, a COB (Chip-On board) method which currently occupies 90% or more has problems such as low productivity caused by a unit level packaging scheme, a high defective rate caused by introduction of dust particles during fabrication processes, high investment and maintenance costs of equipment including a clean room having a high degree of cleanness, and limitations on miniaturization. That is, all color filters and micro-lenses are very vulnerable to introduction of dust particles or penetration of moisture because they are fabricated through a photolithographic process after being coated with photoresist. Therefore, according to the COB method, the mounting of the image sensor chip, a wiring operation, the installation of the IR filter, lens and holder, and the like should be carried out in a clean room in which a high degree of cleanness is maintained.

On the contrary, if an image sensor that has been packaged in advance is used, it is possible to solve the aforementioned problems caused when the bare chip is used.

FIG. 1 shows a schematic sectional view of a ceramic leadless chip carrier (CLCC) most frequently used as an image sensor package. In a conventional image sensor package 20 shown in the figure, an image sensor chip 22 is mounted on a ceramic substrate 24 by using epoxy or the like such that the surface thereof faces upward, and the image sensor chip is then covered with a glass cover or glass substrate 21. In order to connect the image sensor chip 22 to the ceramic substrate 24, wires 26 connected to the image sensor chip 22 are connected to connection terminals 27 formed on a floor of the ceramic substrate 24, and the image sensor package 20 is connected to a circuit board by the connection terminals 27.

Another package method is to apply a chip scale package scheme (CSP) to an image sensor chip. This method allows an image sensor chip to be packaged at a wafer level contrary to the chip-on board (COB) method in which an image sensor chip as a bare chip is mounted on a camera module, thereby preventing dust or moisture from penetrating into an image sensing area.

An image sensor package 30 shown in FIG. 2 has been proposed by Schellcase Inc. Specifically, an image sensor chip 32 of which a bottom surface is polished to a thickness of about 100 micrometers is first prepared, an adhesive such as epoxy is coated to form an adhesive layer 34 on a top surface of the image sensor chip with a circuit formed thereon, a glass substrate 31 is then attached to the adhesive layer, an adhesive such as epoxy is then coated to form an adhesive layer 33 on the polished bottom surface, and a glass wafer 35 is then attached to the formed adhesive layer. Then, a dicing blade having a slightly gentle tip angle is used to remove a region between the image sensor chip 32 and the adhesive layer 34, thereby exposing input/output pads of the circuit formed on the top surface of the image sensor chip 32. Further, lateral sides of the image sensor chip 32, adhesive layer 33, and glass wafer 35 are formed to be inclined at a certain angle by using equipment such as a semiconductor wafer cutter (dicing saw). Next, metal wires 36 are formed to extend from the input/output pads of the exposed image sensor chip 32 via the inclined lateral side surfaces to a bottom surface of the glass wafer 35. At this time, the metal wires 36 are formed by forming a metal film from the input/output pads of the exposed image sensor chip 32 via the inclined lateral side surfaces to the bottom surface of the glass wafer 35 and by etching the metal film to form a desired pattern. Finally, connection terminals 37 such as solder balls are formed at ends of the metal wires 36 formed on the bottom surface of the glass wafer 35. The connection terminals 37 will be connected to external terminals or a printed circuit board (PCB). Such an image sensor package available from Shellcase Inc. can be completed to conform to the size of an actual image sensor chip.

As another example of CSP, an image sensor package proposed by the present applicant shown in FIGS. 3A and 3B.

The image sensor package 40 of FIG. 3A comprises a glass substrate 41, metal wires 44 formed on the glass substrate 41, an insulating film 45 for protecting the metal wires 44, an image sensor chip 42 electrically connected to the glass substrate 41 by flipchip solder joints 43, and connection terminals 47 such as solder balls formed outside the image sensor chip 42 and connected to a printed circuit board. Meanwhile, a dust-seal layer 46 is formed between the glass substrate 41 and the image sensor chip 42 to prevent foreign substances from being introduced into a space defined between the glass substrate 41 and the image sensor chip 42.

An image sensor package 50 for a camera module shown in FIG. 3B comprises a glass substrate 51, metal wires 54 formed on the glass substrate 51, an insulating film 55 for protecting the metal wires 54, an image sensor chip 52 electrically connected to the glass substrate 51 by flipchip solder joints 53, and passive elements 58 and connection terminals 57 mounted on the metal wires 54 outside the image sensor chip 52. Although the image sensor package 50 shown in FIG. 3B has a structure nearly similar to that of the image sensor package 40 shown in FIG. 3A, it has a structure in which the passive elements 58, such as decoupling capacitors, required to construct a camera module can be mounted together on the glass substrate and the connection terminals 57 for connection with a printed circuit board are provided on one surface of the glass substrate. Therefore, in case of such an image sensor package, it is basically possible to eliminate a printed circuit board in fabricating a camera module.

In addition to the aforementioned package methods, a further package method is to apply a chip on flexible PCB (COF) to an image sensor chip.

An example of an image sensor package manufactured according to the COF package method is shown in FIG. 4. Referring to FIG. 4, an image sensor package 60 includes an image sensor chip 62, a flexible PCB 64, which is formed with printed circuit patterns 64p on a surface of the flexible PCB 64, formed with a through-hole 64h for an image sensing portion of the image sensor chip 62 to be seen, and connected to the image sensor chip 62, and a glass substrate 61 attached to the other surface of the flexible PCB 64 so as to cover the through-hole 64h of the flexible PCB 64.

At this time, portions of the printed circuit patterns 64p around the through-hole 64h of the flexible PCB 64 are electrically connected to pads formed on edges of the image sensor chip 62. That is, using an anisotropic conductive film (ACF) or anisotropic conductive paste (ACP), connecting portions 65 between the printed circuit patterns 64p of the flexible PCB 64 and the pads of the image sensor chip 62 electrically connect the printed circuit patterns 64p of the flexible PCB 64 and the pads of the image sensor chip 62 to each other.

Generally, in the image sensor package 60 of a COF type, when the ACF or ACP is pressed after forming gold bumps on input and output pads of the image sensor chip 62, polymer balls in the ACF or ACP which have conductive surfaces are compressed, so that the electrical connection is achieved. The detailed descriptions thereof will be omitted since the configurations thereof are well known to those skilled in the art.

At this time, the edges of the image sensor chip 62 and the flexible PCB 64 may be bonded with epoxy 66 and the like.

In the mean time, an IR filter or the like may be used as the glass substrate 61, which serves to protect the image sensor chip 62. At this time, the glass substrate 61 and the flexible PCB 64 may be bonded to each other with adhesive or double-sided adhesive tape to be airtight. Next, the structure of a conventional camera module will be described in greater detail with reference to the drawings. First, a conventional camera module having the image sensor package 40 of FIG. 3A among the aforementioned image sensor packages will be described.

As shown in the figure, the conventional camera module comprises the aforementioned image sensor package 40, a printed circuit board 10 on which the image sensor package 40 is mounted, a holder 12 having a lower end fixed to the printed circuit board 10, an IR filter 14 installed at the center of the holder 12, and a lens unit 18 coupled to a lens mounting portion 12c formed at the center of an upper end of the holder 12.

In order to mount the image sensor package 40 on the printed circuit board 10, connection terminals 47 of the image sensor package 40 are soldered to printed circuit patterns (not shown) on the printed circuit board 10. Further, in order to attach the holder 12 to the printed circuit board 10 and attach the IR filter 14 to the holder 12, the IR filter 14 is first bonded to the holder 12 using epoxy 15. Thereafter, epoxy 11 in the form of paste is applied to an edge of the printed circuit board 10, the holder 12 with the IR filter 14 bonded thereto is attached to the epoxy 11 in the form of paste applied to the printed circuit board 10, and the epoxy in the form of paste is then cured at a predetermined temperature to firmly bond the printed circuit board 10 and the holder 12 to each other. When the holder 12 is completely attached to the printed circuit board 10, the lens unit 18 is coupled to the lens mounting portion 12c formed at the center of the upper end of the holder 12.

The lens unit 18 is constructed such that at least one lens 18a is fixedly installed within a hollow cylindrical case, and male threads formed on an outer surface of the case are engaged with female threads formed on an inner surface of the lens mounting portion 12c of the holder 12c. When the lens unit 18 is coupled to the lens mounting portion 12c, the distance between the lens unit 18 and the image sensor package 40, i.e., a focal distance, is adjusted.

In the camera module having such a structure, the thickness of a sidewall of the holder 12 is about 350 to 450 µm, and a tolerance of about 150 µm is required for assembling between the inner wall of the holder 12 and an edge of the glass substrate 41 of the package 40. In the camera module assembled in this way, since the size of the holder 12 is standardized to 5 mm×5 mm, 6 mm×6 mm and the like for application of the camera module to an electronic apparatus, a standardized holder always having a size larger than the size of the image sensor package 40 to be used is employed, resulting in increase in the overall size of the camera module.

Meanwhile, since printed circuit patterns (not shown) are formed on the top surface of the printed circuit board 10, the top surface is not generally even. For this reason, when the holder 12 is attached to the printed circuit board 10, a double-sided adhesive tape cannot be used but epoxy in the form of paste is applied and cured. Such epoxy paste generates vapor or particles during a curing process thereof. At this time, since the holder 12 is hermetically sealed, the vapor or particles do not escape the camera module but adhere to the image sensor package 40 or the IR filter 14. The vapor or particles adhering to the image sensor package 40 or the IR filter 14 may contaminate the image sensor package and IR filter, leading to distortion of a photographed image.

When epoxy in the form of paste is applied and cured on the uneven printed circuit board 10 in order to bond the holder 12 to the printed circuit board as described above, the thickness of the epoxy 11 interposed between the printed circuit board 10 and the printed circuit board 12 varies depending on camera modules to be manufactured. That is, after the epoxy in the form of paste is applied and cured, it is not easy to obtain cured epoxy 11 having an initially intended thickness.

For this reason, the lens unit 18 is manufactured separately and then threadly engaged with the lens mounting portion 12c formed in the holder 12 while adjusting the focal distance between the lens unit 18 and the image sensor package 40 after the printed circuit board 10 and the holder 12 are completely assembled together. That is, even though the same lens unit 18 and image sensor unit 40 are used, the focal distance between the holder 12 with the lens unit 18 mounted thereon and the printed circuit board 10 with the image sensor package 40 mounted thereon varies depending on the thickness of the cured epoxy 11. Accordingly, the focal distance between the lens unit 18 and the image sensor package 40 should be adjusted depending on the thickness of the epoxy 11.

Since the process of adjusting the focal distance between the lens unit 18 and the image sensor package 40 should be individually performed for every camera module to be manufactured, it is a process that requires a great deal of time and is very difficult to be automated among all the processes of manufacturing a camera module. Since the process of adjusting the focal distance requires a great deal of time and manpower as described above, the process increases manufacturing costs of camera modules.

In particular, since the thickness of the cured epoxy 11 may not be uniform even in one camera module, the holder 12 may be obliquely bonded to the printed circuit board 10. This causes misalignment between a lens and an image sensor, leading to a defective product. In particular, in a high pixel camera module on the degree of mega pixels, distortion of a final image is apt to occur due to the misalignment.

Meanwhile, since the image sensor packages 20 and 30 shown in FIGS. 1 and 2 are also formed with the connection terminals 27 and 37 on their bottom surfaces, respectively, similarly to the image sensor package 40 shown in FIG. 3A and assembled into a camera module in the same manner, they have the same problems. Moreover, since the image sensor package 50 shown in FIG. 3B is used without a printed circuit board, the image sensor package 50 is assembled into a camera module in the same manner as described above after a reinforcing plate instead of a printed circuit board is installed below the image sensor package 50 and a holder is bonded to the top of the reinforcing plate. This image sensor package also has the same problems.

SUMMARY OF THE INVENTION

Accordingly, the present invention is conceived to solve the aforementioned problems in the prior art. An object of the present invention is to provide a camera module with a reduced size and height.

Another object of the present invention is to provide a camera module, wherein a holder can be simply and easily assembled.

A further object of the present invention is to provide a camera module, wherein the process of adjusting a focal distance between a camera lens and an image sensor can be eliminated.

A still further object of the present invention is to provide a camera module, wherein a defective rate during a manufacturing process can be reduced.

According to an aspect of the present invention for achieving the objects, there is provided a camera module, comprising an image sensor package having a translucent substrate formed thereon; and a holder having a lower end attached to the translucent substrate of the image sensor package.

Preferably, the holder comprises a horizontal portion formed with a through-hole and a connecting portion extending downwardly from an edge of the horizontal portion, and an end surface of a lower end of the connecting portion is formed with an inner stepped portion so as to be attached to a peripheral portion of a top surface and a lateral surface of the translucent substrate.

Alternatively, it is preferred that the holder comprise a horizontal portion formed with a through-hole and a connecting portion extending downwardly from an edge of the horizontal portion, and an end surface of a lower end of the horizontal portion be formed to be flat such that it is attached to a peripheral portion of a top surface of the translucent substrate. Otherwise, the holder may comprise a horizontal portion formed with a through-hole, and a bottom surface of the horizontal portion may be attached to at least a peripheral portion of a top surface of the translucent substrate.

The translucent substrate and the holder are preferably attached to each other by means of a double-sided adhesive tape.

A portion of the translucent substrate exposed to the outside may be provided with a light-shielding portion. The light-shielding portion is preferably made of opaque epoxy or paint. The translucent substrate and the holder may be attached to each other by providing an adhesive on a boundary therebetween. At this time, the adhesive preferably includes opaque epoxy or paint.

An IR filter film is preferably attached to or coated on a top surface of the translucent substrate.

Guide pins that extend downwardly and come into contact with a lateral surface of the translucent substrate may be formed integrally with an outer surface of the holder. At this time, the guide pins are preferably removed after the holder and the translucent substrate are bonded to each other.

A lens may be integrally provided in the holder. At this time, the translucent substrate and the holder are preferably attached to each other by means of a double-sided adhesive tape. Alternatively, the translucent substrate and the holder are preferably attached to each other by providing an adhesive on a boundary therebetween.

The image sensor package may comprise an image sensor chip, a ceramic substrate on which the image sensor chip is mounted, the translucent substrate for covering the image sensor chip and the ceramic substrate.

The image sensor package may comprise the translucent substrate, a metal layer formed on the translucent substrate, an image sensor chip electrically connected to the translucent substrate through a flipchip solder joint, a connection pad formed on the metal layer outside the image sensor chip, a dust-seal layer formed between the translucent substrate and the image sensor chip.

The image sensor package may comprise the translucent substrate, a metal layer formed on the translucent substrate, an image sensor chip electrically connected to the translucent substrate through a flipchip solder joint, a passive element and a connection pad formed on the metal layer outside the image sensor chip and connected to a printed circuit board, a dust-seal layer formed between the translucent substrate and the image sensor chip.

The image sensor package may comprise an image sensor chip, a flexible PCB formed with a printed circuit pattern on a surface of the flexible PCB, the flexible PCB being formed with a through-hole for an image sensing portion of the image sensor chip to be seen and being connected to the image sensor chip, and a translucent substrate for covering the through-hole the flexible PCB, wherein a portion of the printed circuit pattern around the through-hole of the flexible PCB is connected to a pad formed on an edge of the image sensor chip. At this time, the translucent substrate preferably includes an JR filter.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference with the accompanying drawings.

Figure 1:
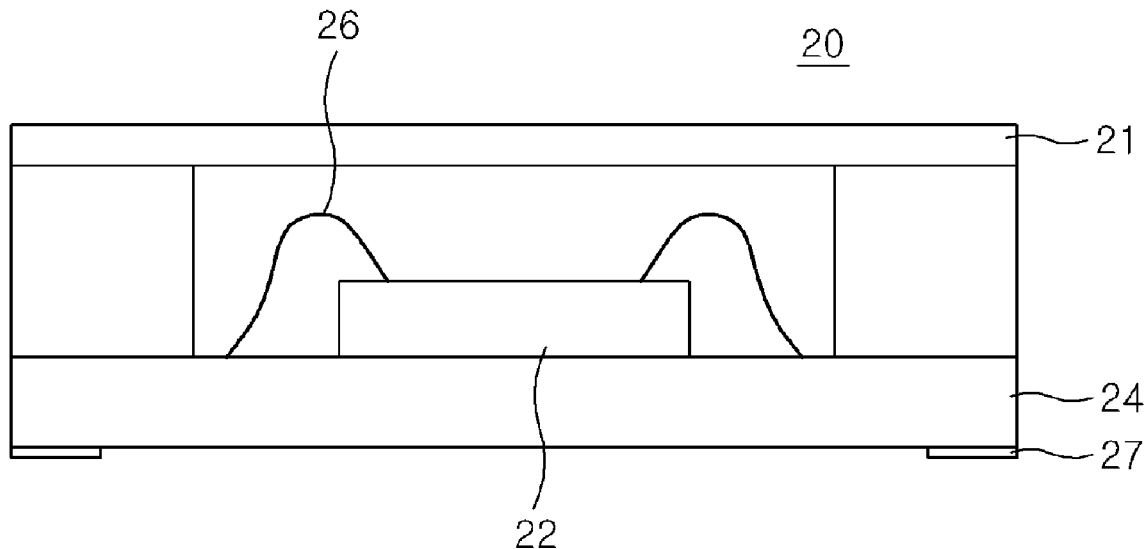
FIGS. 1 to 4 are schematic sectional views of general image sensor packages obtained by packaging image sensor chips.
Figure 2:
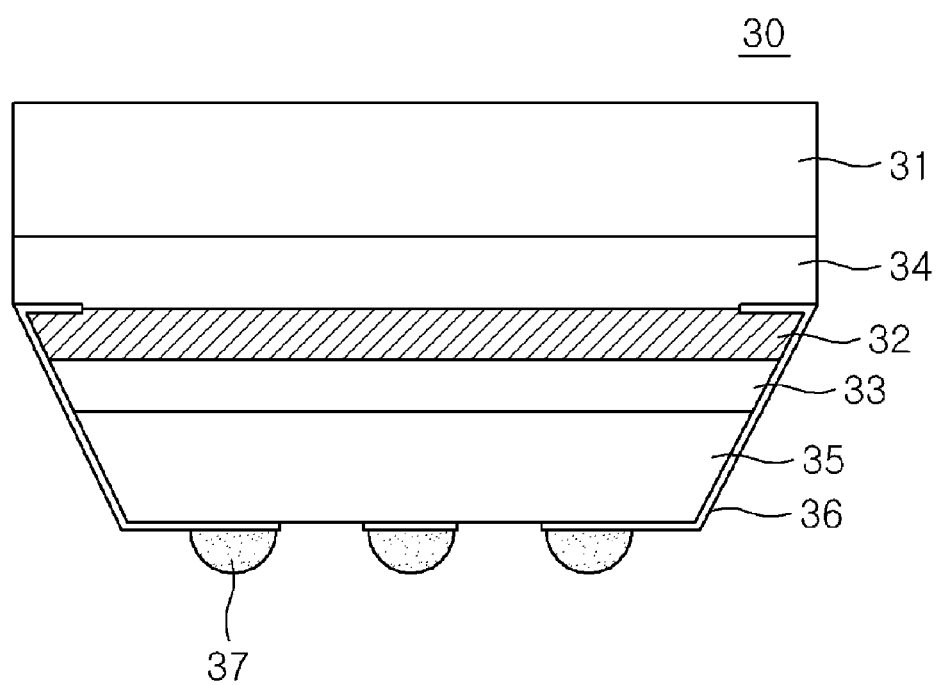
Figure 3A:
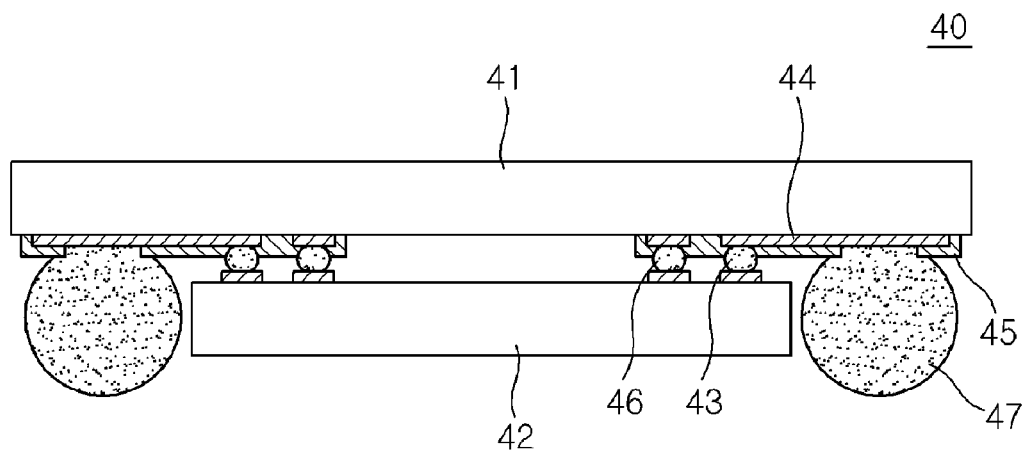
Figure 3B:
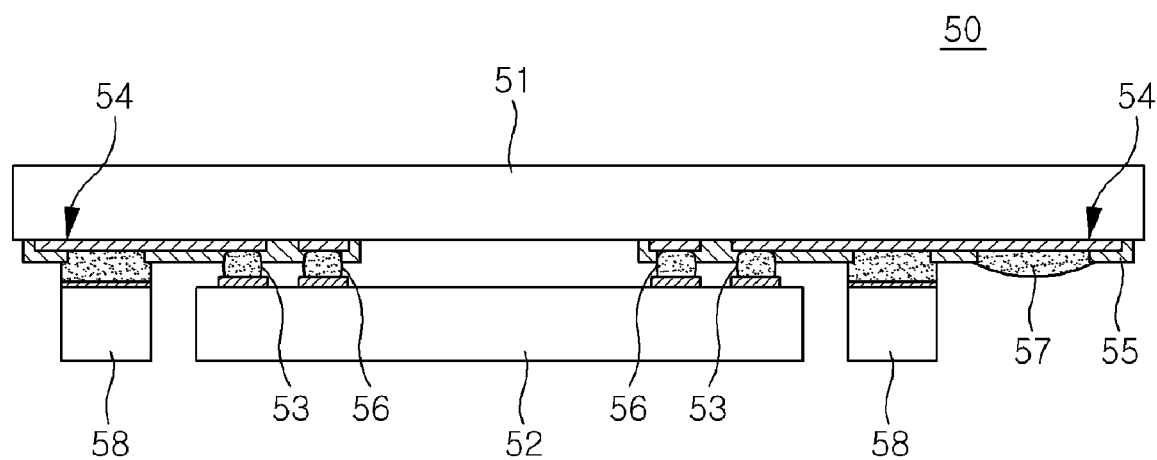
Figure 4:
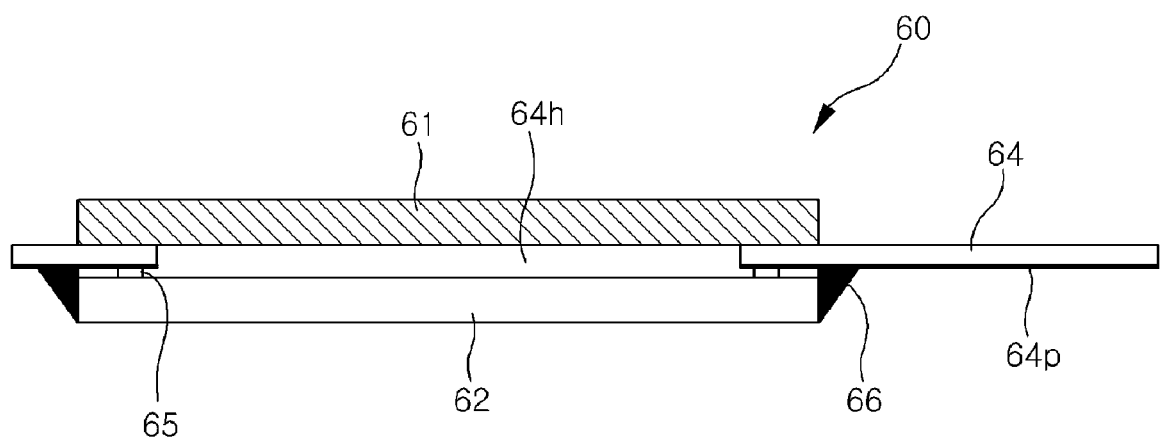

An image sensor package with a glass substrate formed thereon, for example, the image sensor package 20, 30, 40, 50 or 60 described in "Description of the Prior Art," is preferably applied to a camera module of the present invention. A case where the image sensor package 40 shown in FIG. 3A is applied to the camera module of the present invention will be first described below.

Figure 6:
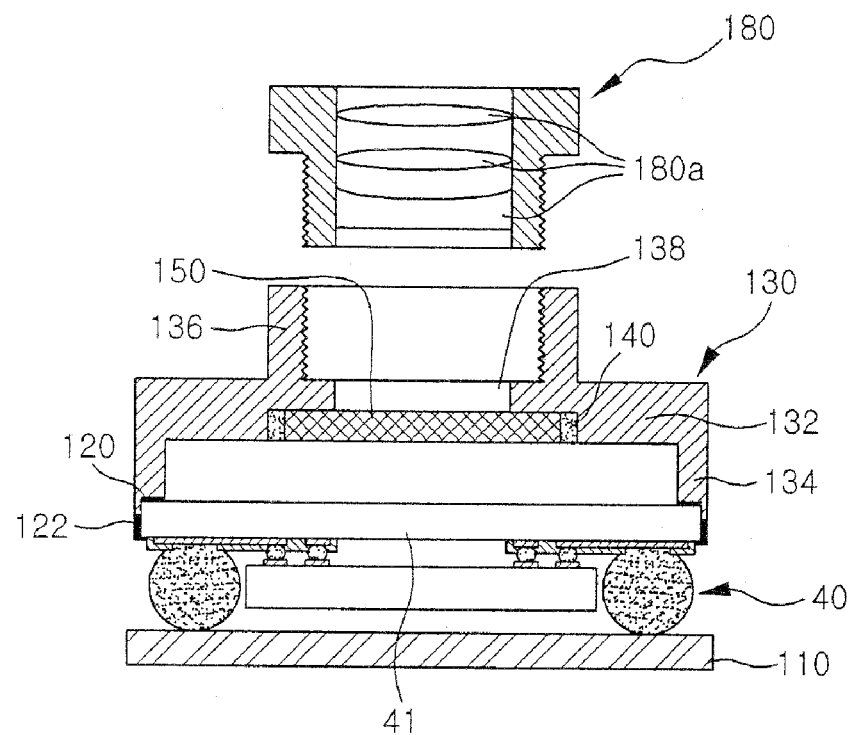
FIG. 6 is a sectional view schematically showing the structure of a camera module according to an embodiment of the present invention.

FIG. 6 is a sectional view showing a camera module according to an embodiment of the present invention. Referring to the figure, the camera module of the present invention comprises the image sensor package 40, a printed circuit board 110 on which the image sensor package 40 is mounted, a holder 130 having a lower end fixed to an edge of a glass substrate 41 provided above the image sensor package 40, an IR filter 150 installed at the center of the holder 130, and a lens unit 180 coupled to the holder 130. In this case, the printed circuit board 110 may be formed to have a width smaller than that of the holder 130.

Since the image sensor package 40 has been already described in "Description of the Prior Art," a description thereof will be omitted herein.

The holder 130 comprises a horizontal portion 132 formed with a through-hole 138 at the center thereof and adapted to cover the glass substrate 41 of the image sensor package 40, a connecting portion 134 extending downwardly from an edge of the horizontal portion 132, and a lens mounting portion 136 extending upwardly in the shape of a hollow cylinder to surround the through-hole 138.

The through-hole 138 is formed with a stepped portion so that upper and lower diameters thereof are different from each other. A smaller diameter portion (upper portion in FIG. 6) of the through-hole 128 has a size corresponding to an image-sensing area (generally referred to as "pixel area") that is located at a central portion of the image sensor package 40. Further, a larger diameter portion (lower portion in FIG. 6) of the through-hole 128 is mounted with the IR filter 150. An inner lower end of the connecting portion 134 is formed with a stepped portion to correspond to a peripheral portion of a top surface and a lateral surface of the glass substrate 41 of the image sensor package 40.

The lens unit 180 to be mounted on the lens mounting portion 136 is constructed such that at least one lens 180a is fixedly installed within a hollow cylindrical case, wherein male threads formed on an outer surface of the case are engaged with female threads formed on an inner surface of the lens mounting portion 136 of the holder 130. The lens unit 180 is coupled to the lens mounting portion after the holder 130 is bonded to the glass substrate 41 of the image sensor package 40. In this case, the distance between the lens unit 180 and the image sensor package 40, i.e., the focal distance, is adjusted.

Alternatively, the lens 180a is not installed within the lens unit 180 but may be integrally provided in the lens mounting portion 136. Now, this structure will be described later. The IR filter 150 is mounted to the holder 130 in advance before the holder 130 is attached to the image sensor package 40. In order to mount the IR filter 150 to the holder 130, epoxy 140 in the form of paste is applied to an inner surface of the larger diameter portion of the through-hole 138, and the IR filter 150 is then fitted into the larger diameter portion. Thereafter, when the holder 130 is heated to a predetermined temperature, the epoxy 140 is cured to firmly attach the IR filter 150 to the holder 130.

A lower end of the holder 130 to which the IR filter 150 is attached as such, specifically, a lower end of the connecting portion 134 is bonded to the glass substrate 41 of the image sensor package 40 by using a double-sided adhesive tape 120. The peripheral portion of the top surface and the lateral surface of the glass substrate 41 to which the lower end of the holder 130 is bonded are smoothly formed contrary to a top surface of the printed circuit board 110 on which printed circuit patterns are formed, so that the holder 130 can be firmly attached to the glass substrate 41 even by the double-sided adhesive tape 120. If the double-sided adhesive tape 120 is used as such, the process of applying and curing epoxy in the form of paste is not required and a contamination source that may be generated during the curing of epoxy can be eliminated. In particular, since the double-sided adhesive tape 120 can have a uniform thickness, the holder 130 can be attached to the image sensor package 40 without being inclined. Although it is shown in the figure that the double-sided adhesive tape 120 is interposed between the peripheral portion of the top surface of the glass substrate 41 and the lower end of the holder 130, in addition to or instead of this, the double-sided adhesive tape may be interposed between a peripheral portion of the lateral surface of the glass substrate 41 and the lower end of the holder 130. In this case, it will be apparent that the holder 130 may be attached to the glass substrate 41 using epoxy rather than a double-sided adhesive tape (in the same manner as attachment of the IR filter 150 to the holder 130).

Preferably, the portion of the glass substrate which is exposed to the outside after the holder 130 is attached to the glass substrate 41 of the image sensor package 40, i.e., a portion of the lateral surface of the glass substrate 41 in FIG. 6, and in some cases, a peripheral portion of a bottom surface of the glass substrate 41, are provided with a light-shielding portion 122 coated with opaque epoxy or paint which prevents light from being transmitted therethrough from the outside.

In this case, when adhesive opaque epoxy or paint is used for the light-shielding portion 122, the holder 130 and the glass substrate 41 are bonded together by applying or filling the opaque epoxy or paint to or into a stepped concave portion between a tip of the lower end of the holder 130 and the lateral surface of the glass substrate 41 and curing the epoxy or paint. However, the opaque epoxy or paint may be used without or along with the double-sided adhesive tape 120 or an adhesive such as epoxy which is interposed between the holder 130 and the glass substrate 41. In particular, since opaque epoxy in the form of paste or paint is cured after being applied to an outer surface of a camera module, there is no possibility that the IR sensor or the image sensor package is contaminated by contaminants including vapor generated during the curing of epoxy. In particular, the holder 130 and the image sensor package 40 are attached to each other without interposition of any adhesive therebetween.

Otherwise, after epoxy as an adhesive is applied to or filled into the stepped concave portion between the tip of the lower end of the holder 130 and the lateral surface of the glass substrate 41 and then cured, a light-shielding portion may be formed on the cured epoxy.

In this case, the connecting portion 134 having an inner width increased by the stepped portion formed inside at the lower end thereof may be formed to be slightly wider than the glass substrate 41, i.e., with a predetermined tolerance. Since the lower end of the connecting portion 134 is bonded to the peripheral portion of the top surface of the glass substrate 41, a certain tolerance is allowable between the inner lateral surface of the lower end of the connecting portion 134 and the outer lateral surface of the glass substrate 41.

Figure 7A:
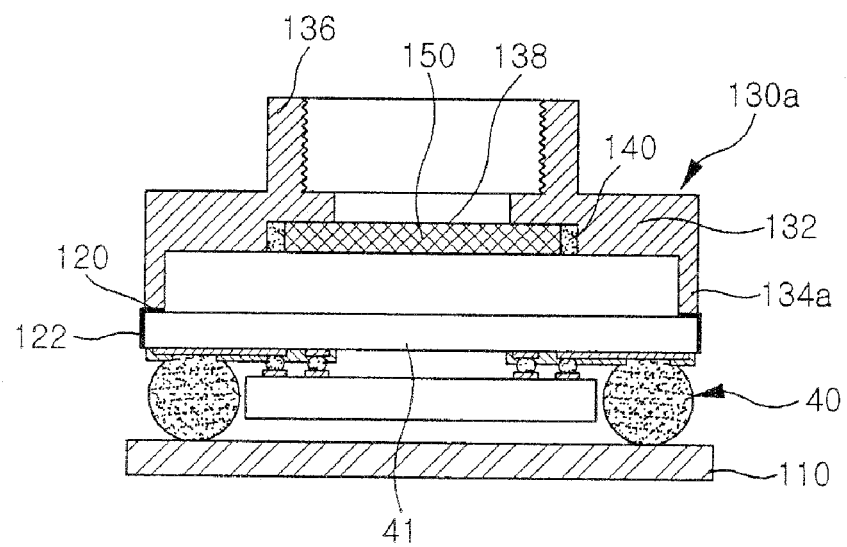
FIGS. 7A and 7B are sectional views schematically showing the structures of camera modules according to other embodiments of the present invention.

Meanwhile, as shown in FIG. 7A, any stepped portion may not be formed at the lower end of the connecting portion of the holder attached to the glass substrate 41. Specifically, in a holder 130a shown in FIG. 7A, a bottom surface of the lower end of the connecting portion 134a extending downwardly from the edge of the holder 130a is formed to be flat, so that the entire bottom surface of the lower end of the connecting portion 134a can be attached to the peripheral portion of the top surface of the glass substrate 41 using the double-sided adhesive tape 122, epoxy or the like. In this case, the light-shielding portion 122 is preferably formed on the entire lateral surface of the glass substrate 41.

Figure 7B:
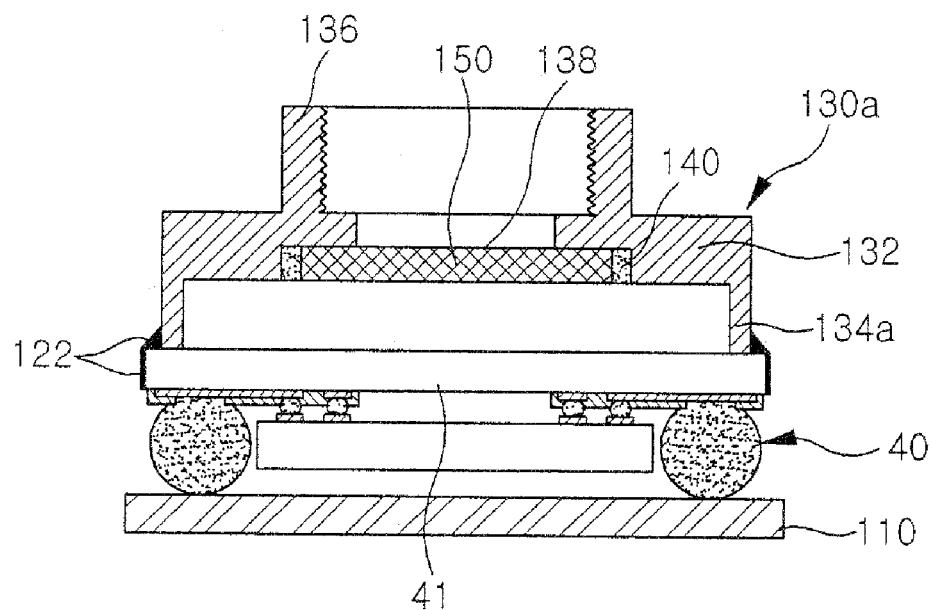

At this time, although FIG. 7 shows that the external width of the holder 130a is equal to the width of the glass substrate 41, the holder 130a may be formed to have an external width smaller than the width of the glass substrate 41 as shown in FIG. 7B. In this case, the light-shielding portion 122 is preferably formed not only on the lateral surface of the glass substrate 41 but also the peripheral portion of the top surface thereof exposed to the outside.

At this time, if adhesive opaque epoxy or paint rather than the double-sided adhesive tape is used for the light-shielding portion 122 between the holder 130a and the glass substrate 41, the light-shielding portion 122 serves not only to shield light but to bond the holder 130a and the glass substrate 41 by applying or filling the opaque epoxy or paint to or into a concave portion formed between the lateral surface of the lower end of the connecting portion 134a of the holder 130a and the peripheral portion of the top surface of the glass substrate 41 exposed to the outside and then curing the opaque epoxy or paint. Here, the light-shielding portion 122 is preferably thick enough to obtain predetermined adhesive strength between the holder and the glass substrate.

Figure 5:
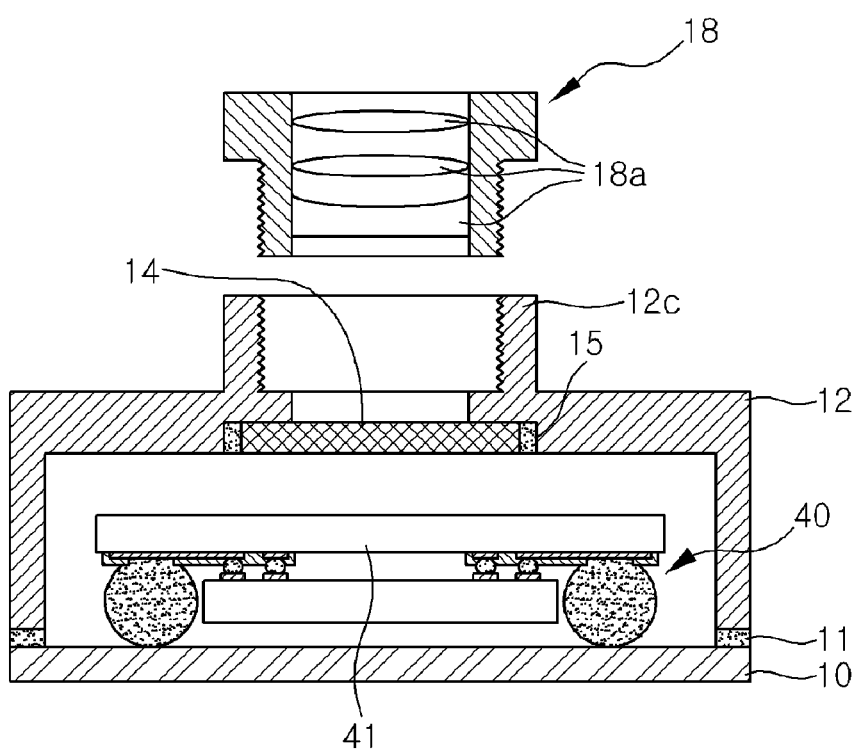
FIG. 5 is a sectional view schematically showing the structure of a conventional camera module.
Figure 8A:
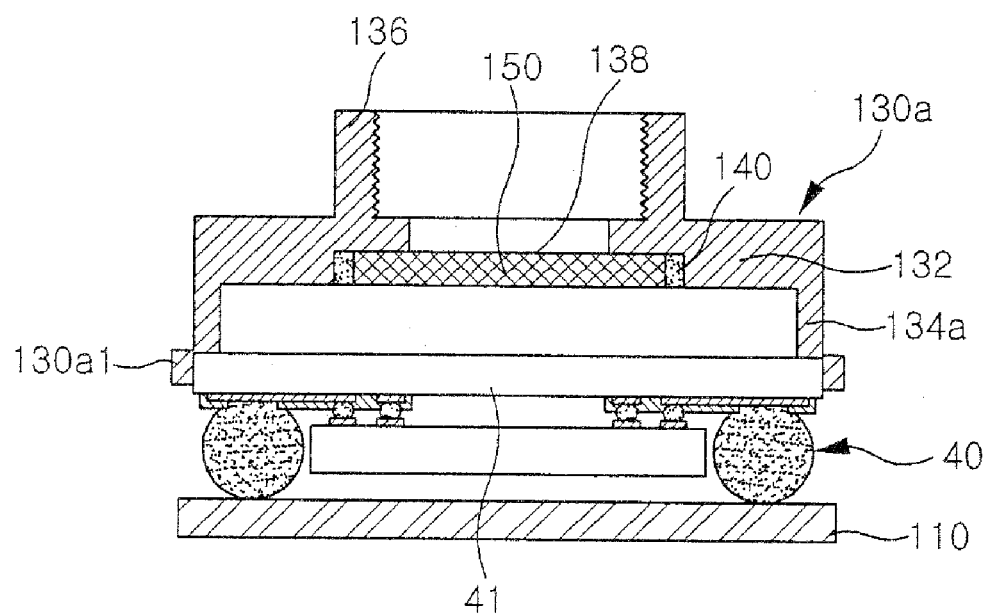
FIGS. 8A to 8B are sectional views schematically showing a modification of a holder capable of being easily aligned with and attached to an image sensor package of the camera module shown in FIG. 7A.

Meanwhile, in order to align and bond the holder 130a constructed as shown in FIG. 7A with and to the glass substrate 41, guide pins 130a1 which extend downwardly and come into contact with the lateral surface of the glass substrate 41 may be formed on outer surfaces of the holder 130a as shown in FIGS. 5A and 5B. The guide pins 130a1 are injection-molded integrally with the holder 130 such that they extend downwardly from each edge of the holder 130a and can be easily removed. As shown in FIG. 5A, the holder 130a is precisely aligned with the glass substrate 41 by means of the guide pins 130a1. After the holder 130a is bonded to the glass substrate 41, the guide pins 130a1 may remain as they are or may be removed as shown in FIG. 7A. FIG. 8A shows a state where the light-shielding portion 122 is not formed. In this state, if the guide pins 130a1 are not removed, the light-shielding portion 122 may be formed only at portions other than the guide pins 130a1. Alternatively, if the guide pins 130a1 are removed, the light-shielding portion may be formed after the guide pins are removed.

Therefore, the embodiment shown in FIG. 6 can be applied to a case where the width of the glass substrate 41 is in a range between the outer width and inner with of the holder 130a, and the embodiment shown in FIGS. 7A and 7B can be applied to a case where the outer width of the holder 130a is smaller than or equal to the width of the glass substrate 41. At this time, since the holder is generally standardized to 5 mm×5 mm, 6 mm×6 mm or the like, a holder having a smaller inner width than the width of the glass substrate 41 can be used in the camera module of the present invention, thereby reducing the overall size of the camera module.

Meanwhile, the distance between the top surface of the glass substrate 41 and the bottom surface of the horizontal portion 132 of the holder 132 can vary depending on the focal distance of the lens and the length of the lens mounting portion 136. In some cases, there may be no space therebetween.

Figure 9:
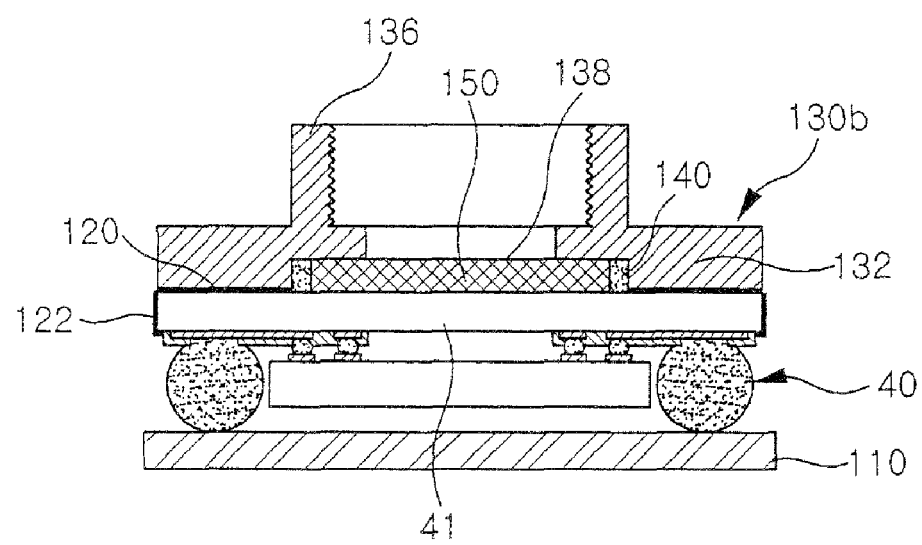
FIG. 9 is a sectional view schematically showing the structure of a camera module according to a further embodiment of the present invention.

That is, as shown in FIG. 9, in the camera module of the present invention, another type of holder 130b to be mounted on the top surface of the glass substrate 41 may comprise a horizontal portion 132 having a through-hole 138 formed at the center thereof and covering the glass substrate 41, and a lens mounting portion 136 extending upwardly in the shape of a hollow cylinder so as to surround the through-hole 138. In this case, the double-sided adhesive tape 120 is interposed between a bottom surface of the horizontal portion 132 and the top surface of the glass substrate 41 so as to bond them to each other. Here, it will be apparent that other adhesives such as epoxy may be used instead of the double-sided adhesive tape 120. In this case, the IR filter 150 is brought into close contact with the glass substrate 41.

Figure 10:
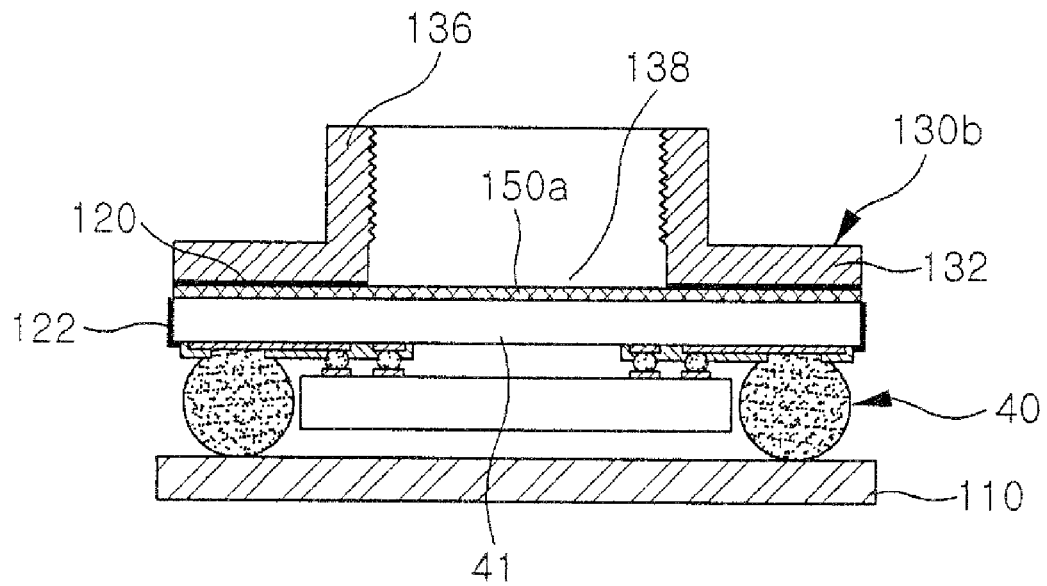
FIG. 10 is a sectional view showing an example in which a tape-like IR filter film is applied to the embodiment shown in FIG. 9.
Figure 11:
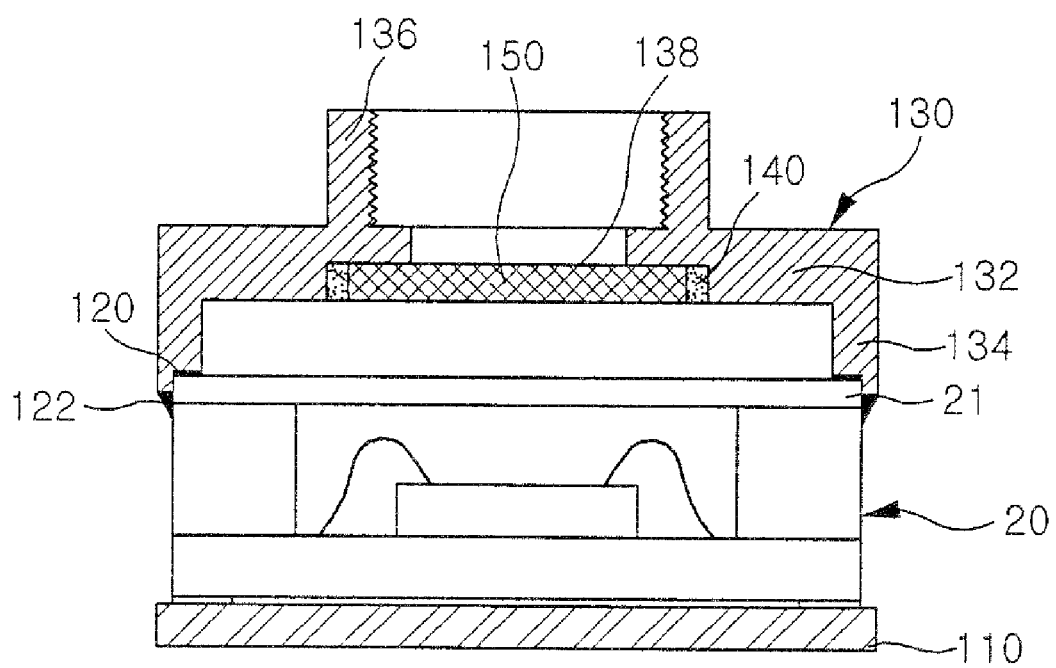
FIGS. 11 to 14 are sectional views showing examples in which the image sensor packages shown in FIGS. 1, 2, 3A, 3B and 4 are applied to the embodiment shown in FIG. 6, respectively.
Figure 12:
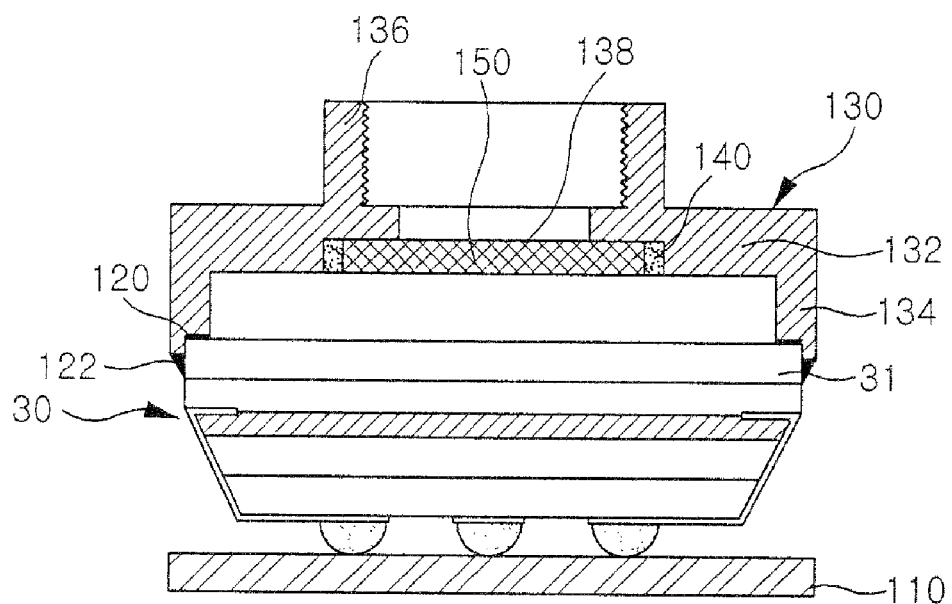

Although the IR filter 150 is mounted to the larger diameter portion of the through-hole 138 formed at the center of the holder 130 in the aforementioned embodiment, it may be alternatively provided in the form of an IR filter film 150a on the glass substrate 41 of the image sensor package 40. That is, the IR filter film 150a may be formed in the shape of a tape and then attached to the glass substrate 41 of the finished image sensor package 40, or the IR filter film 150a may be coated on the glass substrate 41 in advance and integrally formed therewith to fabricate the image sensor package 40. FIG. 10 shows an embodiment in which the IR filter film 150a is attached to or coated on the top surface of the glass substrate 41 and the holder 130b shown in FIG. 9 is attached to the IR filter film. According to the camera module with such a structure, the height as well as the overall width can be reduced as compared with a prior art. In addition, the manufacturing process can be simplified because the attachment of the holder and the IR filter to the image sensor package 40 is simple and easy. It will be apparent that when the IR filter film 150a is attached to or coated on the glass substrate 41 of the image sensor package 40, this can also be equally applied to the aforementioned embodiments other than the holder 130b shown in FIG. 9.

Although the image sensor package 40 shown in FIG. 3A has been applied to the aforementioned embodiment, an image sensor package with a glass substrate formed thereon, for example, the image sensor package 20, 30, 50 or 60 described in "Description of the Prior Art," may be preferably applied to the camera module of the present invention, as described above. FIGS. 11 to 14 show examples in which the image sensor package 20, 30, 50 and 60 are applied to the present invention.

Camera modules of the present invention shown in FIGS. 11 to 14 have structures in which the holder 130 shown in FIG. 6 is attached to the image sensor packages 20, 30, 50 and 60, respectively. In the camera modules of the present invention, a holder is attached to the glass substrate 41 constituting the top of the image sensor package 40 rather than a printed circuit board. Since all the camera modules of the present invention shown in FIG. 6 and FIGS. 11 to 14 have the glass substrates 21, 31, 41, 51 and 61 formed thereon only except that the types of image sensor packages are different from one another, the same scheme is applied. Moreover, the image sensor packages 20, 30, 50 and 60 can also be equally applied to the holders 130a and 130b in the embodiments shown in FIGS. 7A, 7B, 9 and 10 in addition to the embodiments shown in FIGS. 11 to 14 to which the holder 130 shown in FIG. 6 is applied.

Therefore, since descriptions of other embodiments to which the image sensor packages 20, 30, 50 and 60 are applied, including the embodiments shown in FIGS. 11 to 14, are the same as the above description, the descriptions thereof will be omitted herein.

Figure 13:
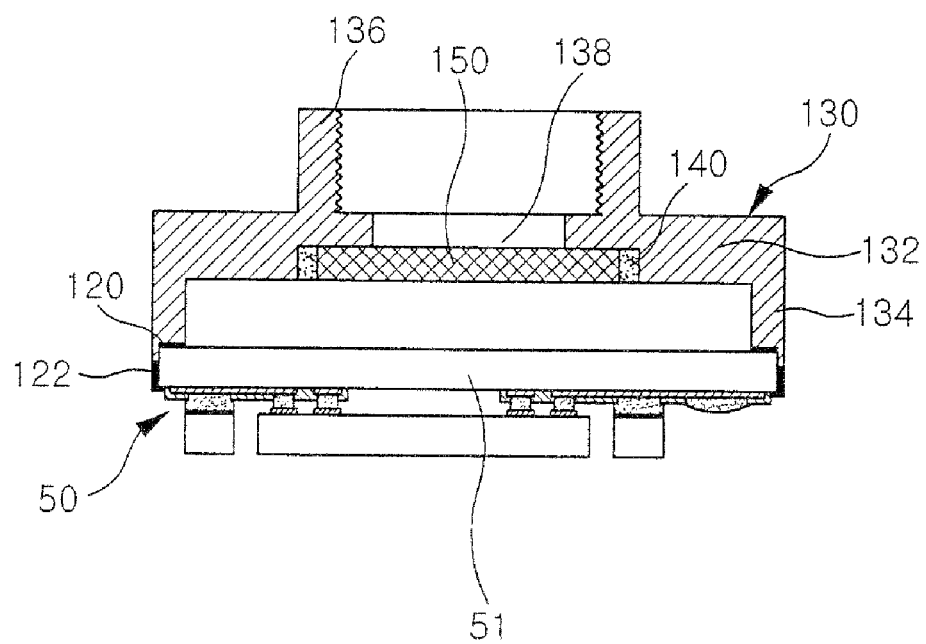
Figure 14:
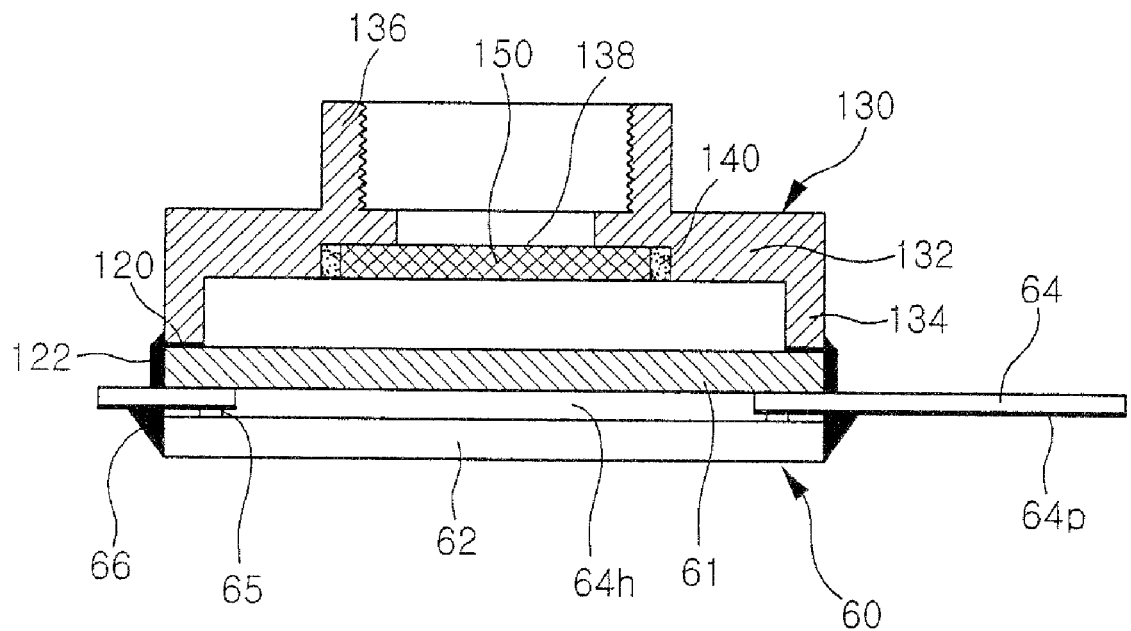

However, the image sensor package 50 applied to the embodiment shown in FIG. 13 has a structure without a printed circuit board. In this case, the image sensor package may be used in the form shown in FIG. 13 or in a state where a separate reinforcing plate (not shown) having a width equal to or smaller than the width of the holder 130 is attached to a bottom surface of the image sensor package 50. Also, in a case of the image sensor package 60 shown in FIG. 14, an IR filter may be used instead of the glass substrate 61. In such a case, it is possible to omit the IR filter 150 from the image sensor package 60 shown in FIG. 14.

Figure 15:
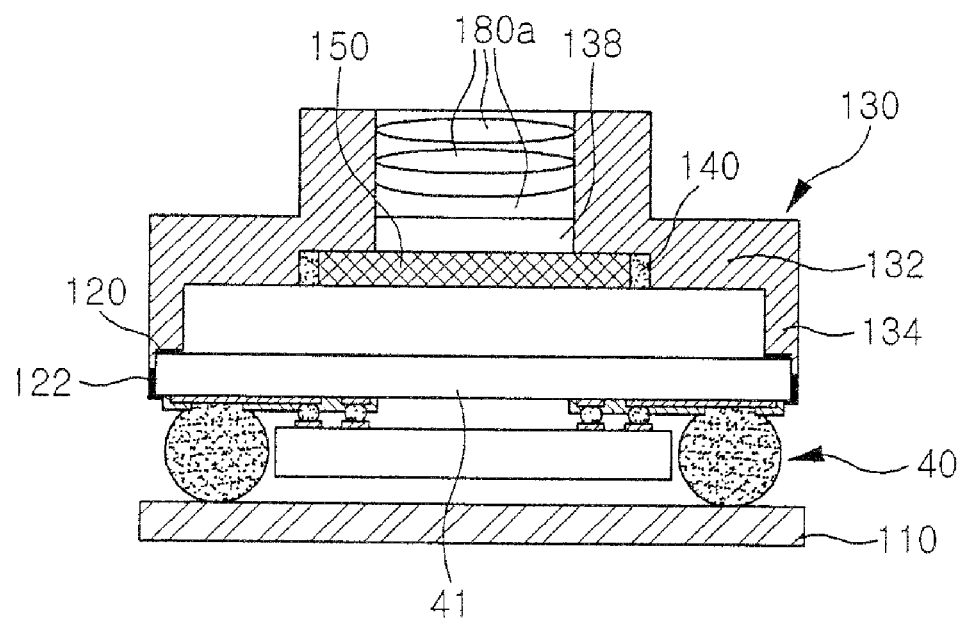
FIG. 15 is a sectional view showing an embodiment in which the camera module shown in FIG. 6 has a lens provided integrally therewith

Meanwhile, contrary to the aforementioned embodiments, the camera module of the present invention may be constructed such that a lens 180a installed within the lens unit 180 is integrally provided in the lens mounting portion 136 of the holder 130 in advance, as shown in FIG. 15. That is, before the holder 130 is bonded to the glass substrate 41 of the image sensor package 40, the lens 180a is integrally provided in the lens mounting portion 136 to fabricate the holder 130 in advance. At this time, while the thickness of the double-sided adhesive tape 20 is taken into consideration, the installation position of the lens 180a, the thickness of the holder 130, the length of the connecting portion 134, and the distance between the lower end of the holder 130 bonded to the glass substrate 41 of the image sensor package 40 and the lens 180a are preset to correspond to the focal distance between the lens 180a and the image sensor package 40.

Preferably, the prefabricated lens-integrated holder 130 is installed on the glass substrate 41 of the image sensor package 40 after the image sensor package 40 is first bonded to a PCB 110 through a surface mounting technology (SMT) process. This is because a plastic lens or IR filter is deteriorated rapidly in durability at a temperature of 85 degrees or higher and thus it hardly resists a high temperature during the SMT process. However, if a heat-resistant lens and holder is used, the lens-integrated holder 130 may be coupled to a PCB after it is first installed on the glass substrate 41 of the image sensor package 40.

In the present invention, when the double-sided adhesive tape 120 is interposed between the lower end of the holder 130 and the glass substrate 41 of the image sensor package 40 to bond them to each other, the thickness of the double-sided adhesive tape 120 is not changed after the completion of the bonding. Therefore, even though the lens 180a is installed integrally with the holder 130 in advance and the resulting unit is attached to the image sensor package 40, the distance between the lens 180a and the image sensor package 40 is obtained as intended initially. That is, there is no need for a separate process of adjusting the focal distance between the lens 180a and the image sensor package 40.

Meanwhile, when the lens 180a is installed integrally with the lens mounting portion 136 in advance, it is preferred that the holder 130 and the glass substrate 41 of the image sensor package 40 be bonded to each other using the light-shielding portion 122 such as adhesive opaque epoxy or paint without using the double-sided adhesive tape 120. That is, the holder 130 and the glass substrate 41 are bonded to each other by coating adhesive opaque epoxy or paint on the stepped concave portion between the tip of the lower end of the holder 130 and the lateral surface of the glass substrate 41 and curing the epoxy or paint. In this case, since the double-sided adhesive tape 120 is not interposed between the holder 130 and the glass substrate 41, the focal distance between the lens 180a integrally provided in the holder 130 and the image sensor package 40 can be preset in consideration of only the installation position of the lens 180a, the thickness of the horizontal portion 132 of the holder 130, and the length of the connecting portion 134, without considering the thickness of the double-sided adhesive tape 120.

As such, although the embodiment shown in FIG. 15 in which the lens 180a is installed in the lens mounting portion 136 of the holder 130 in advance is a modification of the embodiment shown in FIG. 6, it will be apparent that the present invention is not limited thereto and the modification can also be applied to the embodiments shown FIG. 7A, FIG. 7B, and FIGS. 9 to 14.

Although the present invention has been described with reference to the drawings and the illustrative embodiments, it will be understood by those skilled in the art that the present invention can be variously modified and changed without departing from the spirit and scope of the present invention defined by the appended claims.

For example, in the aforementioned embodiments, it will be obvious that the glass substrate provided on the image sensor package does not mean only a substrate made of glass but includes a translucent substrate made of, for example, transparent plastics, quartz or the like.

Further, when adhesive opaque epoxy or paint is used for the light-shielding portion 122 in the aforementioned embodiments, the holder 130 and the glass substrate 41 are bonded to each other by coating or filling the opaque epoxy or paint on or into the stepped concave portion between the tip of the lower end of the holder 130 and the lateral surface of the glass substrate 41 and curing the opaque epoxy or paint, as shown in FIG. 6. However, this embodiment is not limited to this structure. That is, the holder and the glass substrate may be bonded to each other by coating adhesive opaque epoxy or paint for the light-shielding portion on a boundary between the holder and the glass substrate.

Figure 8B:
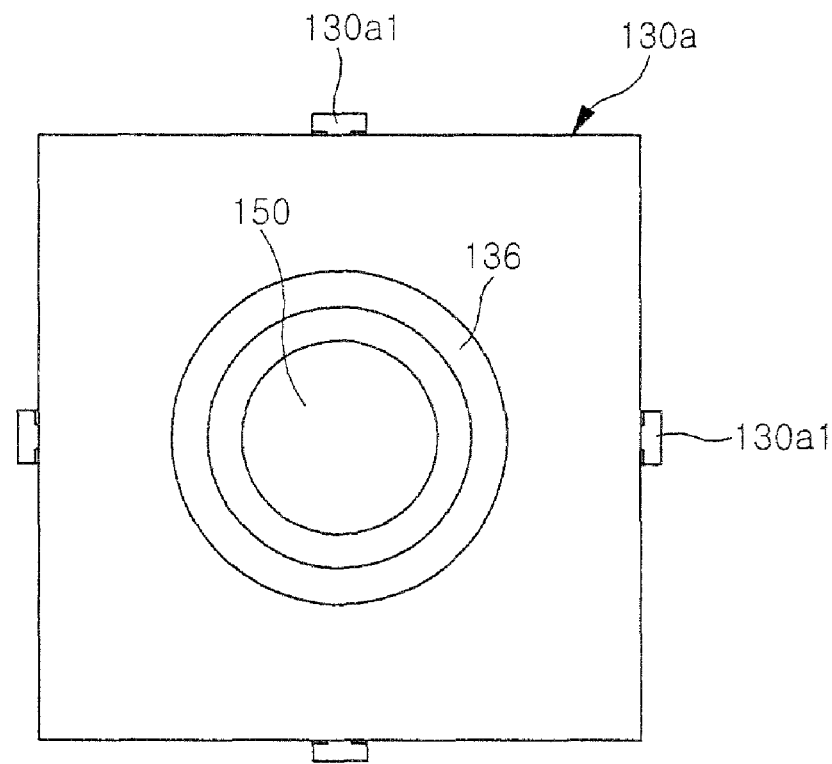

Further, the guide pins shown in FIGS. 8A and 8B can be equally applied not only to the embodiment shown in FIG. 7A but also to the embodiments shown in FIGS. 6, 9 and 10.

According to the camera module of the present invention constructed as above, since the width and height of the camera module can be reduced, an apparatus to which the camera module is applied can be miniaturized.

Further, since the process of coating and curing an adhesive such as epoxy in the form of paste can be eliminated, the process of assembling a camera module can be simplified and facilitated, leading to reduction in manufacturing costs. In particular, since it is not necessary to cure epoxy in the form of paste as described above, creation of resultant foreign substances such as vapor can be reduced and the holder can be bonded to the image sensor package without being inclined. Thus, a defective rate of camera modules to be assembled can be decreased.

Moreover, since the focal distance between the lens and the image sensor package can be easily adjusted even though the lens is integrally provided in the holder, an additional process of adjusting the focal distance is eliminated and the total number of manufacturing processes can be reduced accordingly.

What is claimed is:

1. A camera module, comprising:
an image sensor package having a translucent substrate formed thereon; and
a holder having a lower end attached to the translucent substrate of the image sensor package,
wherein the image sensor package comprises a translucent substrate; a patterned metal layer formed on the translucent substrate; a patterned insulating film formed on the metal layer to form at least one through-hole; an image sensor chip coupled to the metal layer formed on the translucent substrate by a flipchip solder joint through the at least one through-hole formed on the insulating film; a solder ball formed on the metal layer outside the image sensor chip; and a dust-seal layer formed between the metal layer formed on the translucent substrate and the image sensor chip inside a region defined by the flipchip solder joint,
wherein guide pins that extend downwardly and come into contact with a lateral surface of the translucent substrate are formed integrally with an outer surface of the holder, and wherein the guide pins are removed after the holder and the translucent substrate are bonded to each other.

2. The camera module as claimed in claim 1, wherein the holder comprises a horizontal portion formed with a through-hole and a connecting portion extending downwardly from an edge of the horizontal portion, and
an end surface of a lower end of the connecting portion is formed with an inner stepped portion so as to be attached to a peripheral portion of a top surface and a lateral surface of the translucent substrate.

3. The camera module as claimed in claim 1, wherein the holder comprises a horizontal portion formed with a through-hole and a connecting portion extending downwardly from an edge of the horizontal portion, and
an end surface of a lower end of the horizontal portion is formed to be flat such that it is attached to a peripheral portion of a top surface of the translucent substrate.

4. The camera module as claimed in claim 1, wherein the holder comprises a horizontal portion formed with a through-hole, and
a bottom surface of the horizontal portion is attached to at least a peripheral portion of a top surface of the translucent substrate.

5. The camera module as claimed in claim 1, wherein the translucent substrate and the holder are attached to each other by means of a double-sided adhesive tape, and the double-sided adhesive tape is attached on a surface of the translucent substrate on which the metal layer is not formed.

6. The camera module as claimed in claim 1, wherein a portion of the translucent substrate exposed to the outside is provided with a light-shielding portion.

7. The camera module as claimed in claim 1, wherein the translucent substrate and the holder are attached to each other by providing an adhesive on a boundary therebetween.

8. The camera module as claimed in claim 1, wherein an IR filter film is attached to or coated on a top surface of the translucent substrate.

9. The camera module as claimed in claim 1, wherein a lens is integrally provided in the holder.

10. The camera module as claimed in claim 6, wherein the light-shielding portion is made of opaque epoxy or paint.

11. The camera module as claimed in claim 7, wherein the adhesive includes opaque epoxy or paint.

12. A camera module, comprising an image sensor package having a translucent substrate formed thereon; and a holder having a lower end attached to the translucent substrate of the image sensor package,
wherein the image sensor package comprises a translucent substrate; a patterned metal layer formed on the translucent substrate; a patterned insulating film formed on the metal layer to form at least one through-hole; an image sensor chip coupled to the metal layer formed on the translucent substrate by a flipchip solder joint through the at least one through-hole formed on the insulating film; a passive element and a connection pad formed on the metal layer outside the image sensor chip and a dust-seal layer formed between the metal layer formed on the translucent substrate and the image sensor chip inside a region defined by the flipchip solder joint,
wherein guide pins that extend downwardly and come into contact with a lateral surface of the translucent substrate are formed integrally with an outer surface of the holder, and wherein the guide pins are removed after the holder and the translucent substrate are bonded to each other.

13. A camera module, comprising:
an image sensor package having a translucent substrate formed thereon; and
a holder having a lower end attached to the translucent substrate of the image sensor package,
wherein the image sensor package comprises a translucent substrate; a metal wire formed on the translucent substrate; an image sensor chip electrically connected to the translucent substrate through a flipchip solder joint; a connection pad formed on the metal wire outside the image sensor chip; and a dust-seal layer formed between the translucent substrate and the image sensor chip,
wherein guide pins that extend downwardly and come into contact with a lateral surface of the translucent substrate are formed integrally with an outer surface of the holder, and
wherein the guide pins are removed after the holder and the translucent substrate are bonded to each other.

* * * * *